(12) United States Patent
Sawatari et al.

(10) Patent No.: US 7,379,306 B2
(45) Date of Patent: May 27, 2008

(54) MULTILAYER SUBSTRATE INCLUDING COMPONENTS THEREIN

(75) Inventors: Tatsuro Sawatari, Gunma (JP); Masashi Miyazaki, Gunma (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 190 days.

(21) Appl. No.: 11/114,781

(22) Filed: Apr. 25, 2005

(65) Prior Publication Data

US 2005/0255303 A1 Nov. 17, 2005

(30) Foreign Application Priority Data

Apr. 26, 2004 (JP) .............................. 2004-129834

(51) Int. Cl.
*H05K 1/18* (2006.01)
*H05K 7/00* (2006.01)
(52) U.S. Cl. ...................... 361/761; 361/760; 174/260; 174/262; 438/637
(58) Field of Classification Search ................ 361/760, 361/761, 777; 174/262, 260
See application file for complete search history.

(56) References Cited

U.S. PATENT DOCUMENTS

| | | | |
|---|---|---|---|
| 3,663,866 A | 5/1972 | Iosue et al. | |
| 5,048,179 A | 9/1991 | Shindo et al. | |
| 5,353,195 A | * 10/1994 | Fillion et al. | ................ 361/760 |
| 6,323,439 B1 * | 11/2001 | Kambe et al. | ............... 174/262 |
| 6,710,263 B2 * | 3/2004 | Kobayashi et al. | ......... 174/260 |
| 6,975,516 B2 * | 12/2005 | Asahi et al. | ................ 361/761 |

FOREIGN PATENT DOCUMENTS

| | | |
|---|---|---|
| JP | 1426539 | 3/1974 |
| JP | 61287132 | 12/1986 |
| JP | 2003347741 | 12/2003 |
| WO | WO 00/25558 | 5/2000 |
| WO | WO 03/103355 | 12/2003 |

* cited by examiner

*Primary Examiner*—Tuan T. Dinh
*Assistant Examiner*—Andargie Aychillhum
(74) *Attorney, Agent, or Firm*—Knobbe Martens Olson & Bear LLP (57) ABSTRACT

Components having different heights are installed in a multilayer substrate using a metal core layer formed by bonding a plurality of metal layers. The metal core layer includes through-holes and a spot-faced portion. Passive components and an active component are disposed in the through-holes and the spot-faced portion, respectively. These components are connected to conductive patterns formed on wiring layers, with connecting vias therebetween. Contact faces of each component with the connecting vias are controlled so as to be disposed at the same level with the metal layers.

16 Claims, 5 Drawing Sheets

MULTILAYER SUBSTRATE INCLUDING COMPONENTS THEREIN

BACKGROUND OF THE INVENTION

1. Field of the Invention

The present invention relates to a multilayer substrate including components therein, and in particular, to a multilayer substrate including components therein that is useful for installing components having different dimensions in the substrate.

2. Description of the Related Art

In order to achieve a high density mounting of electronic components, a multilayer substrate including components therein has been produced. In such a multilayer substrate including components therein, the components are embedded inside of the wiring substrate. For example, PCT Publication No. WO 03/103355 discloses a structure of such a multilayer substrate including components therein. As shown in FIG. 5 in this patent document, a component is installed in a through-hole formed in a core member composed of a metal. According to this structure, a multilayer substrate that is excellent in the protection of the component and in the heat dissipation effect can be provided.

In addition, in order to adjust the height of the components to be installed, the above patent document discloses a structure including a height-adjusting member 30 shown in FIG. 3. According to this structure in which the height of the component to be installed is adjusted, even when components having different dimensions are installed, contact positions of these components can be adjusted. Therefore, this structure can be preferably used when contact holes for connecting in a face-up manner are formed using a laser.

However, in the method using such a height-adjusting member, in addition to the step of disposing desired components to be installed, a step of disposing the height-adjusting member is required. Accordingly, an improvement is desired.

SUMMARY OF THE INVENTION

Accordingly, the present invention provides a multilayer substrate including components therein that is useful for installing components having different dimensions in the substrate.

In order to achieve the above object, according to a first aspect of the present invention, in a multilayer substrate including components therein, the components are disposed in accommodating portion provided in a metal core, and both top and bottom faces of the metal core and the accommodating portion are sealed with an insulating layer. In the multilayer substrate according to the first aspect of the present invention, the metal core includes a plurality of metal layers.

Herein, the accommodating portion include a through-hole penetrating the top and bottom faces of the metal core and a spot-faced portion that is opened in either the top face or the bottom face of the metal core. The accommodating portion are formed so as to have shapes according to the dimension of the components to be installed therein. The accommodating portion can be formed by etching the metal core.

The components disposed in the accommodating portion include active components such as a transistor and an integrated circuit; and passive components such as a capacitor, an inductor, and a filter. These components can be appropriately selected. These components are disposed in the accommodating portion provided in the metal core and are sealed with the insulating layer from both top and bottom faces of the metal core.

The metal core protects the components, which are installed in the accommodating portion when sealing with the insulating layer. Furthermore, the metal core has a preferable function to dissipating heat of a component that generates heat and can also function as a shield of an active component. In addition, the metal core can be used as a conductive pattern, a power supply line, or a ground (GND) line. The metal core is preferably composed of copper considering the workability by etching, the mechanical rigidity, the heat dissipation effect, and the conductivity.

According to the present invention, since the metal core is composed of a plurality of metal layers, the etching of the metal core can be performed stepwise. Therefore, the accommodating portion can be formed according to the height of the components. Unlike the known structure including the height-adjusting member disclosed in the above-cited patent document, the height of the accommodating portion can be adjusted by etching the metal layers according to the structure of the present invention. Consequently, the production process can be simplified. Furthermore, the metal core can be etched stepwise in the present invention. Therefore, even when the etching aspect ratio is low, the metal core can be etched with a higher aspect ratio compared with a metal core composed of a single metal layer.

The plurality of metal layers is preferably bonded each other by a resin layer therebetween. According to this structure, the resin layer can function as a protector while the metal layers are etched. Therefore, the plurality of metal layers being bonded together can be etched stepwise. The resin layer is preferably composed of a material that has etching resistance to the etchant used for etching the metal layers. More preferably, the resin layer is composed of a material having a high adhesiveness for the metal layers.

The plurality of metal layers forming the metal core preferably has the same thickness. Such a structure can decrease the warping of the metal core. When three metal layers are bonded together, a metal layer disposed at the center of the metal core may have a thickness larger than that of other two metal layers, which have the same thickness.

According to a second aspect of the present invention, in a multilayer substrate including components therein, the components are disposed in accommodating portion provided in a metal core, both top and bottom faces of the metal core and the accommodating portion are sealed with an insulating layer, and the components are connected to a conductive pattern provided on the insulating layer with connecting vias provided in the insulating layer. In the multilayer substrate according to the second aspect of the present invention, the metal core includes a first metal layer and a second metal layer, the accommodating portion include a first accommodating portion formed by removing the first metal layer and a second accommodating portion formed by removing the first metal layer and the second metal layer, and the components include a first component disposed in the first accommodating portion and a second component disposed in the second accommodating portion.

The conductive pattern provided on the insulating layer may be provided on both top and bottom faces of the metal core. Alternatively, the conductive pattern may be provided on either the top face or the bottom face of the metal core. The installed components are preferably connected to the conductive pattern in a face-up manner. The connecting structure with the face-up manner is also described in the above-cited patent document. This specification includes the content described in the patent document as a reference description of the present invention.

The first accommodating portion has a structure suitable for receiving a component having a small height. The first accommodating portion can receive a component having a height corresponding to the thickness of a single metal layer. When the metal core is formed by bonding a plurality of metal layers with at least one resin layer therebetween, the resin layer may also be removed to form the first accommodating portion.

The second accommodating portion has a structure suitable for receiving a component having a large height. The second accommodating portion can receive a component having a height corresponding to the thickness of a plurality of metal layers. When the metal core is composed of at least three metal layers, the first and the second accommodating portion may be formed as follows. For example, the first accommodating portion may be formed by removing two metal layers and the second accommodating portion may be formed by removing three metal layers. Thus, the number of sheets to be removed in the second accommodating portion is larger than that in the first accommodating portion. The present invention also includes such an embodiment.

Contact faces of the first component and the second component with the connecting vias are preferably disposed at the same level. This structure allows the connecting vias to have a certain length. As a result, contacts for the connecting vias can be formed in the insulating layer with a constant laser output.

According to a third aspect of the present invention, in a multilayer substrate including components therein, the components are disposed in accommodating portion provided in a metal core, both top and bottom faces of the metal core and the accommodating portion are sealed with an insulating layer, and the components are connected to a conductive pattern provided on the insulating layer with connecting vias provided in the insulating layer. In the multilayer substrate according to the third aspect of the present invention, the metal core includes a first metal layer and a second metal layer, the accommodating portion include a first accommodating portion formed by removing the first metal layer and a second accommodating portion formed by removing the first metal layer and the second metal layer, the components include a first component disposed in the first accommodating portion and a second component disposed in the second accommodating portion, and the connecting vias include a via for heat dissipation connected to the second metal layer.

When the second metal layer is used as a foundation, the second metal layer can be utilized as a conductor for dissipating heat. Thus, when a component that significantly generates heat is disposed in the first accommodating portion, the generated heat can be preferably dissipated. Accordingly, the first component is preferably an active component and the second component is preferably a passive component. In order to fix the first component with the second metal layer, the first component is preferably bonded with an adhesive having a high thermal conductivity or bonded with a thin adhesive layer.

According to a fourth aspect of the present invention, in a multilayer substrate including components therein, the components are disposed in accommodating portion provided in a metal core, both top and bottom faces of the metal core and the accommodating portion are sealed with an insulating layer, and the components are connected to a conductive pattern provided on the insulating layer with connecting vias provided in the insulating layer. In the multilayer substrate according to the fourth aspect of the present invention, the metal core includes a first metal layer and a second metal layer bonded with a resin layer therebetween, the accommodating portion include a first accommodating portion formed by removing the first metal layer and the resin layer and a second accommodating portion formed by removing the first metal layer, the second metal layer, and the resin layer, and the components include a first component disposed in the first accommodating portion and a second component disposed in the second accommodating portion.

Thus, the accommodating portion are formed by removing the bonding resin layer. This structure can bring the component disposed in the first accommodating portion closer to the second metal layer. Accordingly, the stability of mounting and the heat dissipation effect of the component can be improved.

According to a fifth aspect of the present invention, in a multilayer substrate including components therein, the components are disposed in accommodating portion provided in a metal core, both top and bottom faces of the metal core and the accommodating portion are sealed with an insulating layer, and the components are connected to a conductive pattern provided on the insulating layer with connecting vias provided in the insulating layer. In the multilayer substrate according to the fifth aspect of the present invention, the metal core includes a first metal layer and a second metal layer bonded with a resin layer therebetween, the accommodating portion include a first accommodating portion formed by removing the first metal layer and a second accommodating portion formed by removing the first metal layer, the second metal layer, and the resin layer, and the components include a first component disposed in the first accommodating portion and a second component disposed in the second accommodating portion.

Thus, the accommodating portion including the bonding resin layer is formed. In such a case, the component can be fixed using the resin layer. Consequently, the component can be arranged more accurately, and in addition, the arrangement process of the component can be simplified.

According to a sixth aspect of the present invention, in a multilayer substrate including components therein, the components are disposed in accommodating portion provided in a metal core, and both top and bottom faces of the metal core and the accommodating portion are sealed with an insulating layer. In the multilayer substrate according to the sixth aspect of the present invention, the metal core includes a first metal layer and a second metal layer bonded with a resin layer therebetween, and a through-hole conductor piercing the metal core is provided at an area formed by removing the resin layer, the first metal layer, and the second metal layer.

Thus, the through-hole conductor piercing the metal core is provided. As a result, the conductive patterns provided on both top and bottom faces of the metal core can be electrically connected to each other, thereby improving the design flexibility of wiring. In addition, the first metal layer and the second metal layer may be connected to each other using this through-hole conductor so as to provide a GND layer including these metal layers.

The through-hole conductor may be provided with the insulating layer for sealing therebetween. In such a case, the through-hole conductor can be formed as follows. A through-hole formed in the metal core is sealed with the insulating layer. A through-hole is formed by piercing this insulating layer by a laser or drilling. A conductor layer is then formed on the side wall of the through-hole to form the through-hole conductor. Alternatively, the through-hole conductor may be formed by providing a conductor layer on the side wall of the metal core exposed by etching.

According to a seventh aspect of the present invention, in a multilayer substrate including components therein, the components are disposed in accommodating portion provided in a metal core, and both top and bottom faces of the metal core and the accommodating portion are sealed with an insulating layer. In the multilayer substrate according to the seventh aspect of the present invention, the metal core includes a first metal layer and a second metal layer bonded with a resin layer therebetween, and a plurality of through-hole conductors piercing the metal core is provided in a single area formed by removing the resin layer, the first metal layer, and the second metal layer, with the insulating layer therebetween.

Thus, a plurality of through-hole conductors is formed in a single area provided in the metal core. In such a case, the through-hole conductors can be disposed at a high density, compared with the case where each through-hole conductor is provided in a separate area. In the plurality of through-hole conductors disposed in the single area, the center distance between the adjacent through-hole conductors is preferably less than three times of the thickness of one of the metal layers. In view of the etching aspect ratio of the metal layers, when the through-hole conductors are disposed with a small interval, it is desirable that a plurality of through-hole conductors is disposed in a single area. As described above, the restriction of the etching aspect ratio can be relieved using a metal core formed by bonding a plurality of metal layers. In addition, this structure is useful for disposing the through-hole conductors at a higher density.

According to an eighth aspect of the present invention, in a multilayer substrate including a component therein, the component is disposed in a accommodating portion provided in a metal core, and both top and bottom faces of the metal core and the accommodating portion are sealed with an insulating layer. In the multilayer substrate according to the eighth aspect of the present invention, the metal core includes a first metal layer and a second metal layer bonded with a resin layer therebetween, the accommodating portion is formed by removing the resin layer, the first metal layer, and the second metal layer, and a through-hole conductor piercing the metal core is provided in the accommodating portion including the component, with the insulating layer therebetween.

As described, by providing the through-hole conductor in the area where the component is disposed, a higher density mounting can be performed. The number of through-hole conductors provided in the accommodating portion with the component may be two or more.

According to a ninth aspect of the present invention, in a multilayer substrate including components therein, the components are disposed in accommodating portion provided in a metal core, and both top and bottom faces of the metal core and the accommodating portion are sealed with an insulating layer. In the multilayer substrate according to the ninth aspect of the present invention, the metal core includes a first metal layer and a second metal layer bonded with a resin layer therebetween and at least a part of each metal layer is shared as a GND layer.

Thus, the first metal layer and the second metal layer that are separated by the bonded structure are shared as the GND layer. In such a case, a GND structure having a higher stability can be provided. In order to share this GND layer, the first metal layer and the second metal layer are preferably connected to each other with a through-hole conductor piercing the top and the bottom faces of the metal core.

The through-hole conductor may be formed in a through-hole provided in the metal core, with an insulating layer therebetween. Alternatively, the through-hole conductor may be formed by performing a process, such as plating, for providing a conductive layer in the side wall of a through-hole provided in the metal core. Furthermore, instead of such a through-hole conductor, electrical conductivity may be provided to the resin layer bonding the metal layers in order to connect to the metal layers each other. It is sufficient that these connecting processes are performed in at least the area that is shared as the GND layer.

As described above, according to the present invention, even when components having different heights are installed in a multilayer substrate, the height of accommodating portion of the components can be adjusted with a simple method. Accordingly, the present invention can provide a multilayer substrate that is suitable for installing various components therein.

DETAILED DESCRIPTION OF THE PREFERRED EMBODIMENT

Multilayer substrates according to the present invention will now be described in detail with reference to the attached drawings. The present invention is not limited to the following embodiments and can be appropriately modified.

Figure 1:
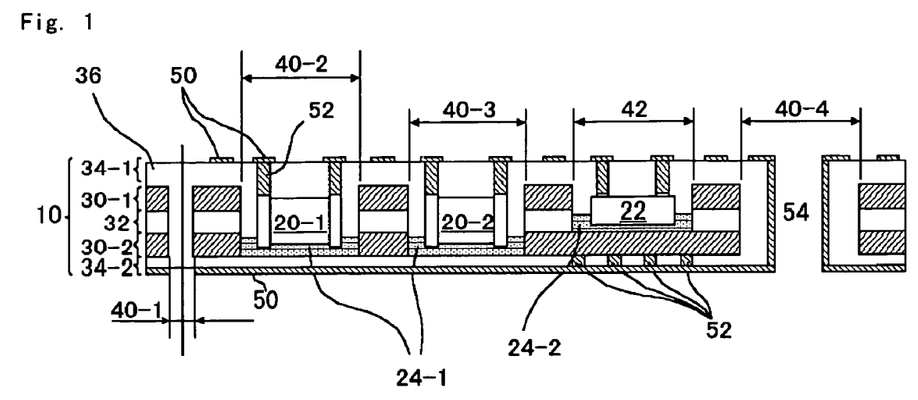
FIG. 1 is a cross-sectional view showing the structure of a multilayer substrate according to a first embodiment of the present invention.

FIG. 1 is a cross-sectional view showing the structure of a multilayer substrate according to a first embodiment of the present invention. As shown in FIG. 1, a multilayer substrate 10 according to the present embodiment includes a metal core layer having metal layers 30-1 and 30-2 and a bonding resin layer 32. The metal layers 30-1 and 30-2 composed of a copper plate are bonded with the bonding resin layer 32 disposed therebetween. Wiring layers 34-1 and 34-2 are disposed on the top face and the bottom face of the metal core layer, respectively. The wiring layers 34-1 and 34-2 include conductive patterns 50 provided on an insulating member 36.

The metal core layer includes through-holes 40-1, 40-2, 40-3, and 40-4 and a spot-faced portion 42. The inside of the through-hole 40-1 is filled with the insulating member 36. Passive components 20-1 and 20-2 are disposed in the through-holes 40-2 and 40-3, respectively. A through-hole conductor 54 piercing the top face and the bottom face of the metal core is disposed in the through-hole 40-4 so that the wiring layer 34-1 is electrically connected to the wiring layer 34-2. An active component 22 is disposed in the spot-faced portion 42. The inside of the through-hole conductor 54 may be filled with an insulating member (not shown).

The through-hole 40-1 serves as a cutting area when cut with a dicer. In other words, the through-hole 40-1 is used when each circuit module is separated from a wiring substrate produced as a multiple substrate including a plurality of the circuit modules. Another through-hole (not shown) for cutting with a dicer is provided at the right of the through-hole 40-4 in the same way.

In the above structure, the passive components 20-1 and 20-2 disposed in the metal core are fixed on the insulating member 36 forming the wiring layer 34-2, with an insulative adhesive 24-1 therebetween. The active component 22 is fixed on the metal layer 30-2 with an adhesive 24-2 such as silver (Ag) paste therebetween, the adhesive 24-2 having a heat dissipation effect and electrical conductivity. The insulating member 36 is filled with spaces formed between these components and the metal core layer. In addition, when a ground electrode is provided on the bottom face of the active component 22, the active component 22 can be connected to the metal core serving as a ground layer, with the adhesive 24-2 therebetween.

The passive components 20-1 and 20-2 and the active component 22 disposed inside of the metal core layer are connected to the conductive patterns 50 with connecting vias 52 provided inside of the insulating member 36. As shown in FIG. 1, each of the components is disposed so that the contact faces with the connecting vias 52 are disposed at the same level. This arrangement can be provided by the following structure.

The passive components 20-1 and 20-2 having a large height are disposed in the through-holes 40-2 and 40-3, respectively, formed by removing the metal layers 30-1 and 30-2 and the bonding resin layer 32. The active component 22 having a small height is disposed in the spot-faced portion 42 formed by removing the metal layer 30-1 and the bonding resin layer 32. Accordingly, the difference in the heights between the passive components and the active component is compensated by the presence or the absence of the metal layer 30-2. As a result, the contact faces of each of the components with the connecting vias 52 are disposed at the same level.

The metal layer 30-2 is connected to the conductive pattern 50 provided on the wiring layer 34-2, with the connecting vias 52 therebetween. This metal layer 30-2 serves as a ground (GND) layer or a heat-dissipating layer.

Thus, the metal core layer is formed by laminating a plurality of metal layers 30-1 and 30-2. As a result, even when each component has a different height, the contact faces with the connecting vias can be controlled so as to be disposed at the same level. Furthermore, the metal layer 30-2 adjacent to the component having a small height can be used as a heat-dissipating conductor. Accordingly, this structure is particularly effective in the case where an active component having a height smaller than that of a passive component is used.

Figure 2:
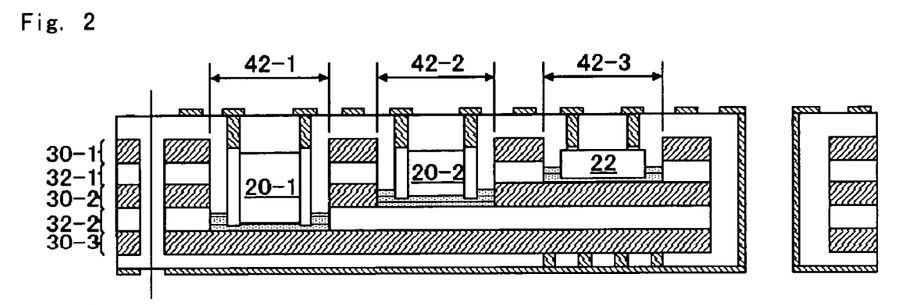
FIG. 2 is a cross-sectional view showing the structure of a multilayer substrate according to a second embodiment of the present invention.

FIG. 2 is a cross-sectional view showing the structure of a multilayer substrate according to a second embodiment of the present invention. The embodiment shown in FIG. 2 is an example including a metal core layer composed of three metal layers. Other structures are the same as those in the above first embodiment. Therefore, the characteristic parts in the present embodiment are mainly described in the following description and the description and reference numerals in the figure in the same parts as those in the first embodiment are omitted.

In the second embodiment, three metal layers 30-1, 30-2, and 30-3 are bonded with bonding resin layers 32-1 and 32-2 therebetween to form the metal core layer. The metal core layer includes spot-faced portions 42-1, 42-2, and 42-3. The spot-faced portion 42-1 is formed by removing the metal layers 30-1 and 30-2 and the bonding resin layers 32-1 and 32-2. The spot-faced portion 42-2 is formed by removing the metal layers 30-1 and 30-2 and the bonding resin layer 32-1. The spot-faced portion 42-3 is formed by removing the metal layer 30-1 and the bonding resin layer 32-1.

Three components 20-1, 20-2, and 22 are disposed in the spot-faced portions 42-1, 42-2, and 42-3, respectively. The contact faces of each component with the connecting vias are controlled so as to be disposed at the same level.

As described above, the use of three metal layers can increase the variation of the height of the component. The present embodiment can also be applied to the structure in which a component is installed in a through-hole formed by removing all the metal layers.

Figure 3:
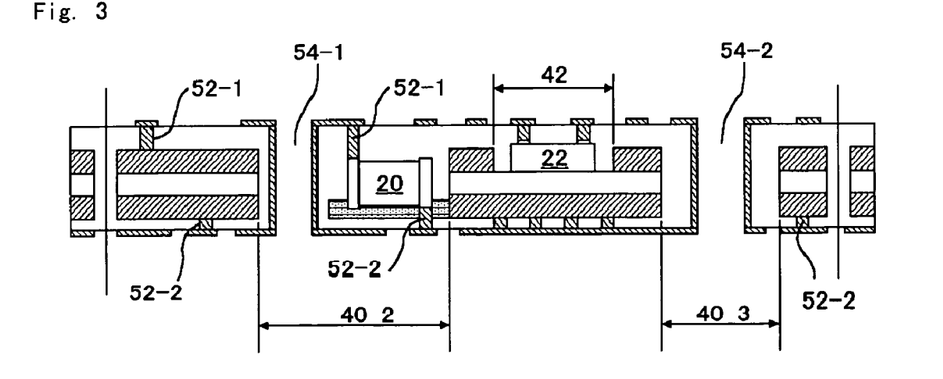
FIG. 3 is a cross-sectional view showing the structure of a multilayer substrate according to a third embodiment of the present invention.

FIG. 3 is a cross-sectional view showing the structure of a multilayer substrate according to a third embodiment of the present invention. According to an example of the embodiment shown in FIG. 3, a component and a through-hole conductor are disposed in the same through-hole, and a greater importance is given to the connection from the metal core layer to the conductive pattern provided on the bottom face. Other structures are the same as those in the above first embodiment. Therefore, the characteristic parts in the present embodiment are mainly described in the following description and the description and reference numerals in the figure in the same parts as those in the first embodiment are omitted.

In the third embodiment, a through-hole conductor 54-1 and a passive component 20 are disposed in a through-hole 40-2 formed in the metal core layer. The passive component 20 is connected to the conductive pattern on the top face, with a connecting via 52-1 therebetween. The passive component 20 is also connected to the conductive pattern on the bottom face, with a connecting via 52-2 therebetween.

In the same way, another connecting via 52-1 is provided at a place where the metal core layer is connected to the conductive pattern on the top face. Also, another connecting via 52-2 is provided at a place where the metal core layer is connected to the conductive pattern on the bottom face. In addition, an active component 22 disposed in the spot-faced portion 42 and a through-hole conductor 54-2 disposed in the through-hole 40-3 are appropriately provided.

As described above, the component and the through-hole conductor are disposed in the same through-hole. This structure can achieve a higher density mounting. Furthermore, the design flexibility of wiring can be improved by utilizing the pattern on the bottom face effectively.

Figure 4:
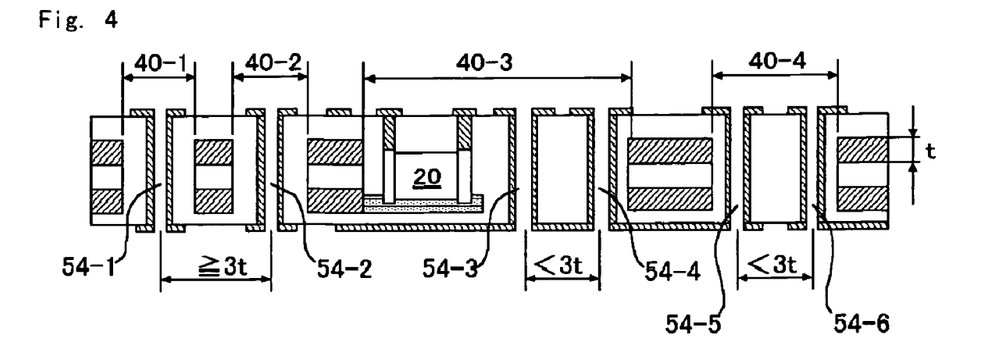
FIG. 4 is a cross-sectional view showing the structure of a multilayer substrate according to a fourth embodiment of the present invention.

FIG. 4 is a cross-sectional view showing the structure of a multilayer substrate according to a fourth embodiment of the present invention. The embodiment shown in FIG. 4 is an example showing a variation of the arrangement of through-hole conductors piercing the metal core layer. Other structures are the same as those in the above first embodiment. Therefore, the characteristic parts in the present embodiment are mainly described in the following description and the description and reference numerals in the figure in the same parts as those in the first embodiment are omitted.

The multilayer substrate according to the fourth embodiment has the following structure. A through-hole conductor 54-1 is disposed in a through-hole 40-1. A through-hole conductor 54-2 is disposed in a through-hole 40-2. A passive component 20 and through-hole conductors 54-3 and 54-4 are disposed in a through-hole 40-3. Through-hole conductors 54-5 and 54-6 are disposed in a through-hole 40-4.

Herein, the through-hole conductors 54-1 and 54-2 are disposed such that the center distance between the through-hole conductors is at least 3 t, i.e., three times of t, wherein t represents the thickness of one of the metal layer. When the center distance between the through-hole conductors is at least 3 t, the metal layers can be etched while the metal core layer remains between the through-hole conductors. Accordingly, each through-hole conductor is disposed in a separate through-hole. This structure is effective in the prevention of interference of signal lines.

In addition, the through-hole conductors 54-3 and 54-4, and the through-hole conductors 54-5 and 54-6 are disposed such that the center distance between the through-hole conductors is less than 3 t, respectively. When the center distance between the through-hole conductors is less than 3 t, it is difficult to etch the metal layers while the metal core layer remains between the through-hole conductors. Accordingly, a plurality of through-hole conductors is disposed in the same through-hole at an interval of less than 3 t to improve the mounting density. In such a case, as shown in FIG. 4, the through-hole conductors 54-3 and 54-4 are disposed in the same through-hole 40-3 as in the component 20, thereby further improving the mounting density.

Figure 5:
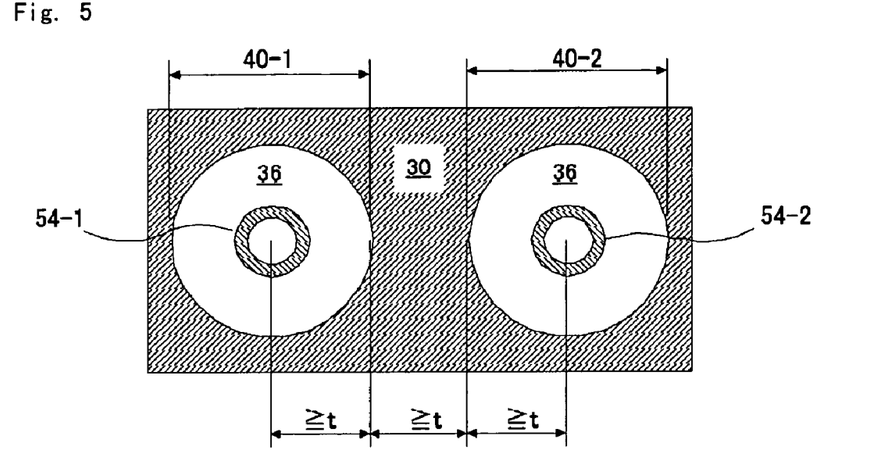
FIG. 5 is a plan view showing the arrangement of through-hole conductors 54-1 and 54-2 shown in FIG. 4.

FIG. 5 is a plan view showing the arrangement of through-hole conductors 54-1 and 54-2 shown in FIG. 4. As shown in FIG. 5, these through-hole conductors 54-1 and 54-2 are concentrically disposed in the centers of the through-holes 40-1 and 40-2 piercing the metal layers 30, respectively. The distance between each center of the through-hole conductors 54-1 and 54-2 and each wall surface of the through-holes 40-1 and 40-2 is at least the thickness t of one of the metal layer. An insulating member 36 fills the space between the wall surface of the through-hole conductor 54-1 and the wall surface of the through-hole 40-1, and the space between the wall surface of the through-hole conductor 54-2 and the wall surface of the through-hole 40-2. Also, the distance between the wall surface of the through-hole 40-1 and that of the through-hole 40-2 is at least the thickness t of one of the metal layer.

Figure 6:
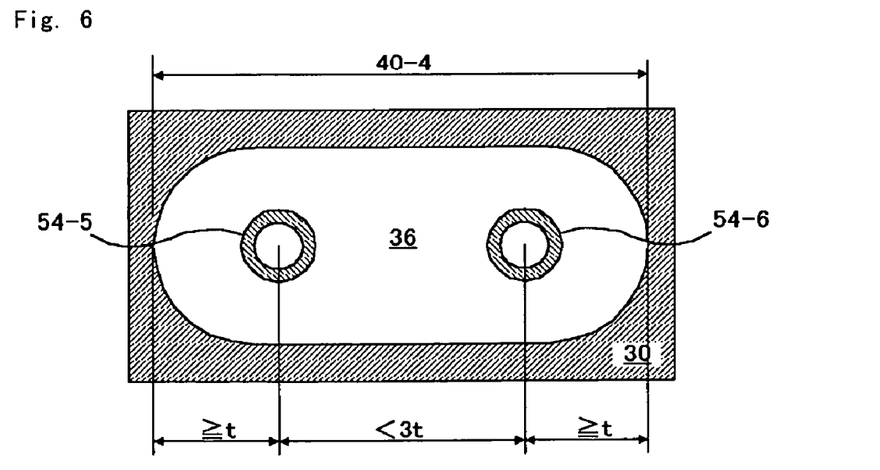
FIG. 6 is a plan view showing the arrangement of through-hole conductors 54-5 and 54-6 shown in FIG. 4.

FIG. 6 is a plan view showing the arrangement of through-hole conductors 54-5 and 54-6 shown in FIG. 4. As shown in FIG. 6, these through-hole conductors 54-5 and 54-6 are disposed inside of the through-hole 40-4 piercing the metal layers 30 such that the center distance between the through-hole conductors 54-5 and 54-6 is less than 3 t. The distance between each center of the through-hole conductors 54-5 and 54-6 and the wall surface of the through-hole 40-4 is at least the thickness t of one of the metal layer. The insulating member 36 fills the space formed by the wall surfaces of the through-hole conductors 54-5 and 54-6 and the wall surface of the through-hole 40-4.

Figure 7:
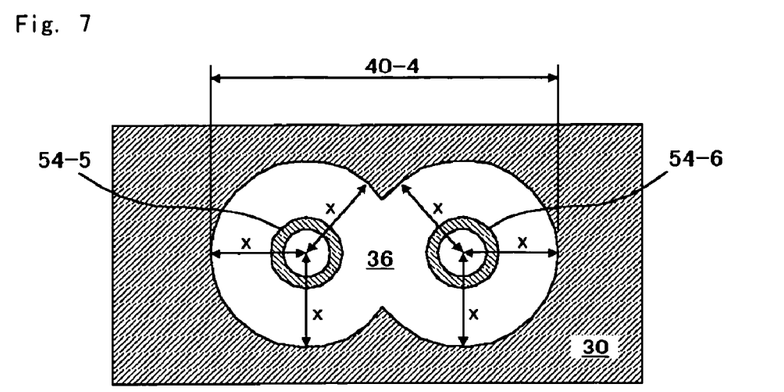
FIG. 7 is a plan view showing a modification of the arrangement of the through-hole conductors 54-5 and 54-6 shown in FIG. 6.
Figure 8:
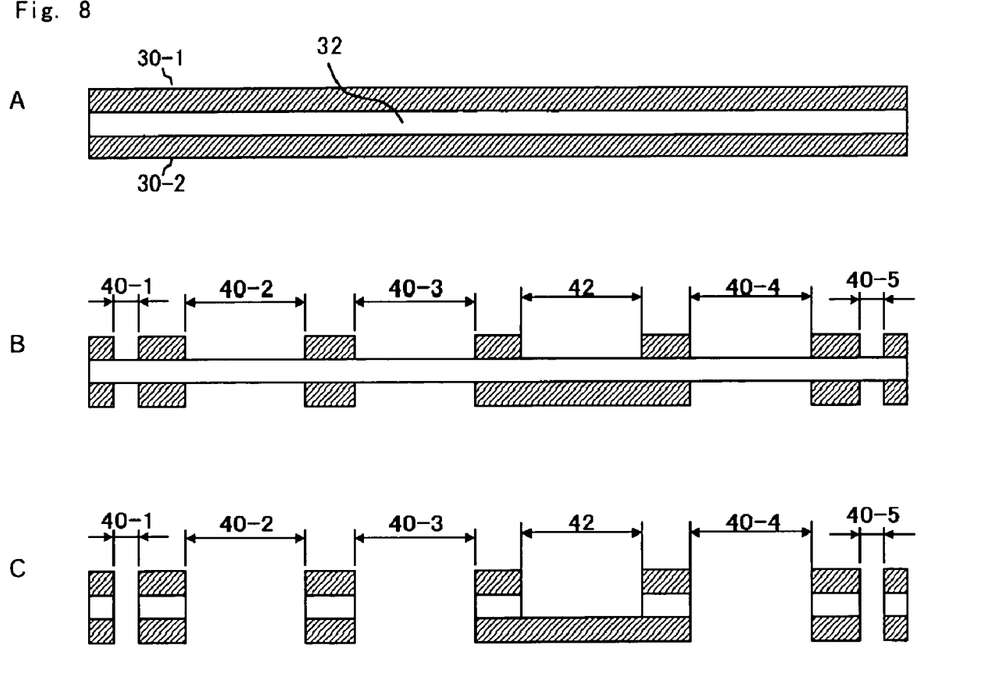
FIGS. 8A to 8C are cross-sectional views showing first steps of producing a multilayer substrate according to the present invention.
Figure 9:
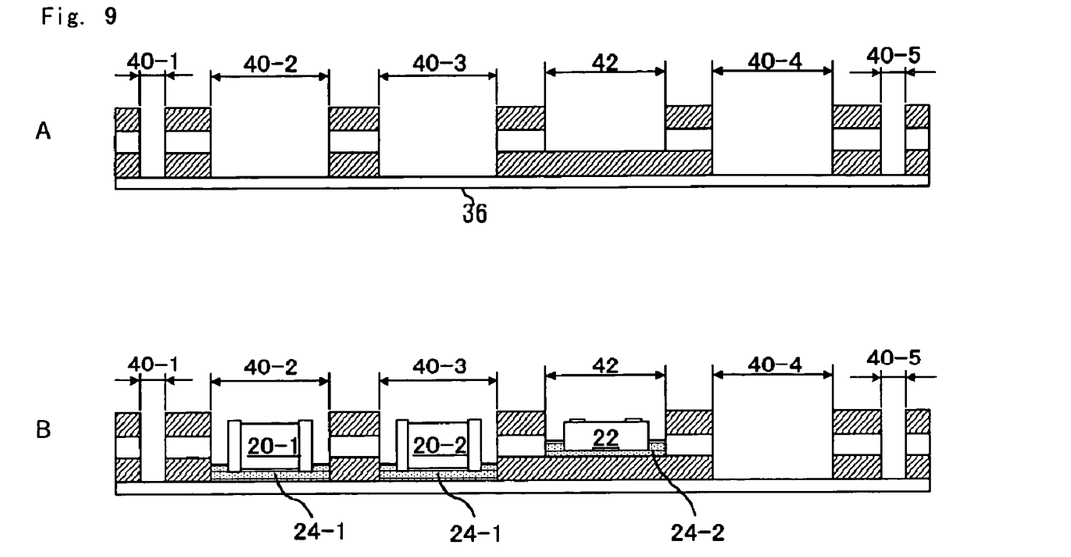
FIGS. 9A and 9B are cross-sectional views showing second steps of producing the multilayer substrate according to the present invention.
Figure 10:
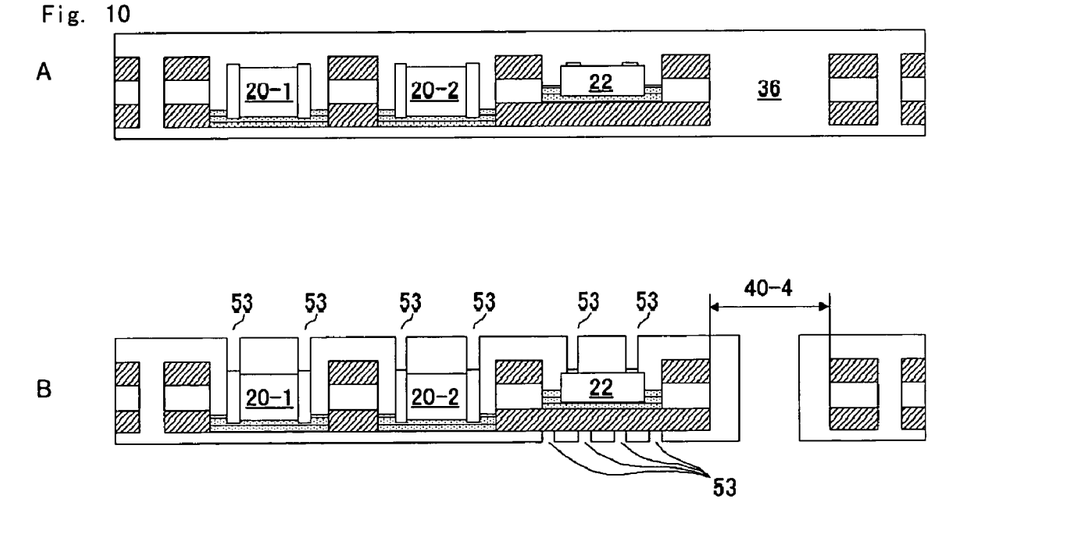
FIGS. 10A and 10B are cross-sectional views showing third steps of producing the multilayer substrate according to the present invention.
Figure 11:
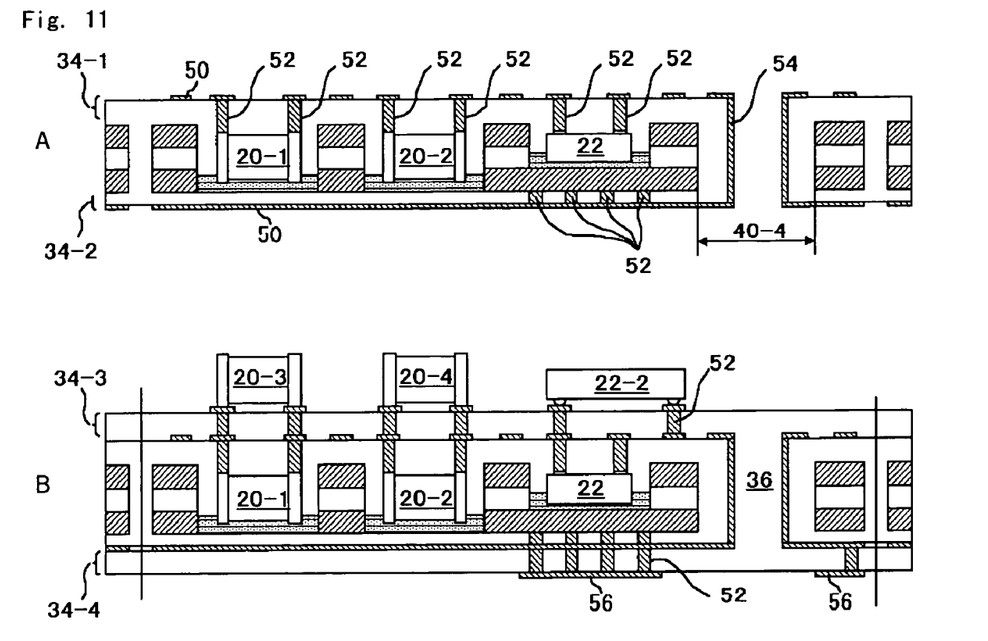
FIGS. 11A and 11B are cross-sectional views showing fourth steps of producing the multilayer substrate according to the present invention.

FIG. 7 is a plan view showing a modification of the arrangement of the through-hole conductors 54-5 and 54-6 shown in FIG. 6. As shown in FIG. 7, these through-hole conductors 54-5 and 54-6 may be disposed closer than the arrangement shown in FIG. 6. In this example, each of the through-hole conductors 54-5 and 54-6 and the through-hole 40-4 are concentrically disposed such that the distance x between the center of each through-hole conductor and the wall surface of the metal layer 30 is a certain value. This structure can stabilize the electrical characteristics and the magnetic properties of signals input in each through-hole conductor.

A method for producing a multilayer substrate according to the present invention will now be described with reference to FIGS. 8A to 11B. The production of the multilayer substrate according to the first embodiment will now be described and repeated descriptions and reference numerals in the figures will be appropriately omitted.

First, as shown in FIG. 8A, two metal layers 30-1 and 30-2 are bonded by pressing, with a bonding resin layer 32 therebetween. Thus, a metal core layer including two metal layers is prepared. This step may be performed by laminating.

Subsequently, as shown in FIG. 8B, the metal layers 30-1 and 30-2 are partly etched at the same time while the bonding resin layer 32 remains at the center. Thus, the metal layers disposed at positions corresponding to through-holes 40-1 to 40-5 and a spot-faced portion 42 are removed.

As shown in FIG. 8C, a part of the bonding resin layer 32 disposed at positions that do not include the metal layers 30-1 and 30-2 thereon is then removed by a laser machining. Thus, the through-holes 40-1 to 40-5 and the spot-faced portion 42 are formed.

Subsequently, as shown in FIG. 9B, an underlayer composed of an insulating member 36 is formed on the bottom face of the metal core layer. The insulating member used as the underlayer is preferably composed of a resin having a low fluidity.

As shown in FIG. 9E, an insulative adhesive 24-1 is then applied on the bottoms of the through-holes 40-2 and 40-3. An adhesive 24-2 having a heat dissipation effect and electrical conductivity is applied on the bottom of the spot-faced portion 42. Passive components 20-1 and 20-2 and an active component 22 are disposed on the through-holes 40-2 and 40-3 and the spot-faced portion 42, respectively, with these adhesives therebetween.

Subsequently, as shown in FIG. 10A, the periphery and the inside of the metal core layer is sealed with the insulating member 36 by pressing resin layers from both sides of the metal core layer. In this step, the insulating member 36 fills the insides of the through-holes and the spot-faced portion 42 formed in the metal core layer. In this step, resin layers having a copper foil thereon may be used as the resin layers to be pressed. In such a case, the resin layers are pressed from the side having the copper foil, thereby sealing the metal core layer with the insulating member.

Subsequently, as shown in FIG. 10B, the insulating member 36 is partly removed by a laser machining to form contacts 53 for connecting vias. When resin layers having a copper foil are used for sealing the metal core layer, the copper foil is removed by etching and the laser machining is then performed. In this step, the insulating layer filled in the through-hole 40-4 is opened so as to form a through-hole used as a through-hole conductor.

Subsequently, as shown in FIG. 11A, connecting vias 52 are formed in the contacts for connecting vias by a semi-additive process using a copper plating. In addition, wiring layers 34-1 and 34-2 are formed on the top face and the bottom face, respectively. As a result, conductive patterns 50 formed on the wiring layers 34-1 and 34-2 are connected to the passive components 20-1 and 20-2 and the active component 22, with the connecting vias 52 therebetween. A through-hole conductor 54 is also formed in the through-hole 40-4, with the insulating layer therebetween.

Finally, as shown in FIG. 11B, other wiring layers 34-3 and 34-4 are formed on the wiring layers 34-1 and 34-2 formed in FIG. 11A, respectively. Passive components 20-3 and 20-4 and an active component 22-2 are mounted on the wiring layer 34-3 disposed on the top face. External terminals 56 are formed on the wiring layer 34-4 disposed on the bottom face. The multilayer substrate is then cut along the vertical lines in the figure to prepare a circuit module that can be mounted on a mother board.

Figure 12:
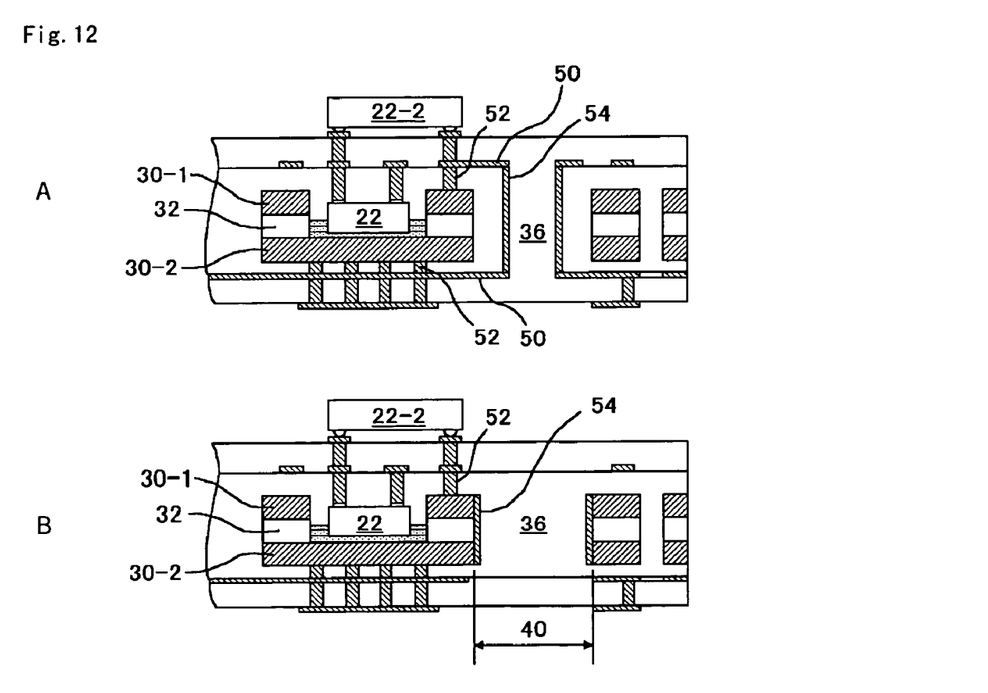
FIGS. 12A and 12B are cross-sectional views showing examples using a metal core layer as a GND.

FIGS. 12A and 12B are cross-sectional views showing examples using a metal core layer as a GND. As shown in FIG. 12A, when the metal core layer is used as the GND, the metal layer 30-1 and the metal layer 30-2 are connected to each other, with the connecting vias 52, the conductive patterns 50, and the through-hole conductor 54 therebetween. This connected area is provided as a GND layer.

Alternatively, as shown in FIG. 12B, a conductor layer serving as a through-hole conductor 54 may be formed on the side wall of the metal core layer exposed by etching. The metal layer 30-1 and the metal layer 30-2 may be connected to each other with this through-hole conductor 54. In the examples shown in FIGS. 12A and 12B, the metal layer 30-1 and the metal layer 30-2 are connected to each other with the through-hole conductor. Alternatively, the metal layer 30-1 and the metal layer 30-2 may be connected to each other by providing the bonding resin layer 32 with electrical conductivity.

According to the present invention, the height of accommodating portion of the components can be adjusted with a simple method. Therefore, the present invention can be applied to a substrate for a highly integrated circuit in which various components are required to be installed.

What is claimed is:

1. A multilayer substrate including components therein in which the components are disposed in accommodating portions provided in a metal core, both top and bottom faces of the metal core and the accommodating portions are sealed with an insulating layer, and the components are connected to a conductive pattern provided on the insulating layer with connecting vias provided in the insulating layer,
    wherein the metal core comprises at least a first metal layer and a second metal layer;
    wherein the accommodating portions comprise
    a first accommodating portion which is formed within a first removed portion of the first metal layer and which is terminally bounded by the second metal layer and
    a second accommodating portion formed within a second removed portion of the first metal layer and a removed portion of the second metal layer and
    wherein the components comprise a first component disposed in the first accommodating portion and a second component disposed in the second accommodating portion.

2. The multilayer substrate including components therein according to claim 1, wherein contact faces for the connecting vias of the first component and the second component are disposed at substantially the same level.

3. The multilayer substrate including components therein according to claim 1,
    wherein the connecting vias comprise a via for heat dissipation connected to the second metal layer.

4. The multilayer substrate including components therein according to claim 1,
    wherein the metal core comprises a first metal layer and a second metal layer bonded with a resin layer therebetween.

5. The multilayer substrate including components therein according to claim 1,
    wherein the metal core comprises at least a first metal layer and a second metal layer bonded with a resin layer therebetween;
    wherein the first accommodating portion is formed within the first metal layer but not within the second metal layer and the resin layer and the second accommodating portion formed within the first metal layer, the second metal layer, and the resin layer.

6. The multilayer substrate including components therein according to claim 1,
    wherein the metal core comprises at least a first metal layer and a second metal layer bonded with a resin layer therebetween; and
    wherein a through-hole conductor piercing the metal core is provided in a hole formed within the resin layer, the first metal layer, and the second metal layer.

7. The multilayer substrate including components therein according to claim 1,
    wherein the metal core comprises at least a first metal layer and a second metal layer bonded with a resin layer therebetween; and
    wherein a plurality of through-hole conductors piercing the metal core is provided in a hole formed within the resin layer, the first metal layer, and the second metal layer.

8. The multilayer substrate including components therein according to claim 1,
    wherein the metal core comprises at least a first metal layer and a second metal layer bonded with a resin layer therebetween;
    wherein at least one of the accommodating portions is formed by within the resin layer, the first metal layer, and the second metal layer; and
    wherein a through-hole conductor piercing the metal core is provided in the accommodating portion including the component.

9. The multilayer substrate including components therein according to claim 1,
    wherein the metal core comprises at least a first metal layer and a second metal layer bonded with a resin layer therebetween and at least a part of each metal layer is shared as a ground layer.

10. The multilayer substrate including components therein according to claim 1, wherein the metal layers are bonded with each other through an intervening resin layer.

11. The multilayer substrate including components therein according to claim 1, wherein the plurality of metal layers have substantially the same thickness.

12. The multilayer substrate including components therein according to claim 3, wherein the first component is an active component and the second component is a passive component.

13. The multilayer substrate including components therein according to claim 7, wherein the distance between the centers of two adjacent through-hole conductors is less than three times the thickness of one of the metal layers.

14. The multilayer substrate including components therein according to claim 9, wherein a through-hole conductor piercing the metal core is provided at an area formed within the resin layer, the first metal layer, and the second metal layer; and wherein the first metal layer and the second metal layer are connected to each other with the through-hole conductor at the area being shared as the ground layer.

15. The multilayer substrate including components therein according to claim 9, wherein a through-hole conductor piercing the metal core is provided in a hole formed within the resin layer, the first metal layer, and the second metal layer; and wherein the first metal layer and the second metal layer are connected to each other with the through-hole conductor at the area being shared as the ground layer.

16. The multilayer substrate including components therein according to claim 9, wherein the resin layer used for bonding the first metal layer to the second metal layer has electrical conductivity at the area being shared as the ground layer.

* * * * *